United States Patent [19]

Grunziger

[11] Patent Number: 5,153,765
[45] Date of Patent: Oct. 6, 1992

[54] OPTICAL TRANSMITTER COMPRISING A LASER DIODE

[75] Inventor: Rupert Grunziger, Neumarkt, Fed. Rep. of Germany

[73] Assignee: U.S. Philips Corp., New York, N.Y.

[21] Appl. No.: 835,094

[22] Filed: Feb. 11, 1992

Related U.S. Application Data

[63] Continuation of Ser. No. 706,546, May 28, 1991, abandoned, which is a continuation of Ser. No. 342,219, Apr. 21, 1989, abandoned.

[30] Foreign Application Priority Data

May 26, 1988 [DE] Fed. Rep. of Germany ....... 3817836

[51] Int. Cl.⁵ .............................................. H04B 10/04
[52] U.S. Cl. ...................................... 359/180; 372/38
[58] Field of Search ............... 359/180, 181, 187, 154; 372/26, 29, 32, 38

[56] References Cited

U.S. PATENT DOCUMENTS

| | | | |
|---|---|---|---|
| 4,504,976 | 3/1985 | Yoshikawa et al. .................. | 372/38 |
| 4,677,632 | 6/1987 | Lisco et al. ............................ | 372/38 |
| 4,733,398 | 3/1988 | Shibagaki et al. ..................... | 372/38 |
| 4,757,193 | 7/1988 | Kollanyi ............................... | 455/613 |
| 4,903,273 | 2/1990 | Bathe .................................... | 372/38 |

FOREIGN PATENT DOCUMENTS 3137491 4/1983 Fed. Rep. of Germany .

Primary Examiner—Edward L. Coles, Sr.
Assistant Examiner—Kinfe-Michael Negash
Attorney, Agent, or Firm—William L. Botjer

[57] ABSTRACT

The described optical transmitter comprises a laser diode (2) and optically coupled thereto a photodiode (3) operating as a monitor diode. The photoelectric current of the monitor diode (3) is used for adjusting the light power of the laser diode (2). In addition, the optical transmitter includes modulators used for modulating the current of the laser diode (IL) by a useful signal ($b_n$) and a pilot signal ($B_k$). The device includes circuitry to control the laser diode, in response to the photodiode, so that jitter in the signal is avoided. The device is capable of operation with bit frequencies in the GHz range.

3 Claims, 1 Drawing Sheet

OPTICAL TRANSMITTER COMPRISING A LASER DIODE

This is a continuation of application Ser. No. 07/706,546, filed May 28, 1991 now abandoned which is a continuation of Ser. No. 07/342,219 filed Apr. 21, 1989 now abandoned.

BACKGROUND OF THE INVENTION

The invention relates to an optical transmitter comprising a laser diode and coupled to the laser diode a photodiode operating as a monitor diode, whose photoelectric current is used for adjusting the light power of the laser diode, and including modulators used for modulating the laser diode current by a useful signal and a pilot signal.

An optical transmitter having these characteristic features is described in the German Patent Specification DE 31 37 497 A1. The purpose of such an optical transmitter is among other things to maintain the light signal leaving the laser diode and being transferred through glass fibres at a constant level in time for virtually all parameters. These parameters may change, for example, owing to a change in environmental conditions or due to the aging process of the laser diode. The laser diode is the component which is subjected most to aging processes, whereas all the other components currently available on the market do not undergo appreciable changes during periods of time comparable to 10 or 15 years.

The aging processes affect, for example, the characteristic line of the laser diode (dependence of the radiated light power P on the current IL of the laser diode). The characteristic line for simplicity consists of two straight lines, a flat portion passing through the zero and attached thereto a steeper portion of the straight line in whose range the diode current is to be situated when the diode is in operation.

When the laser diode is in operation, the laser diode current must not fall below the common point of the two straight lines (i.e. the portions to the right and left of point SO in FIG. 1), the dip in the characteristic line, because in that case distortions will occur in the light signal of the laser. For this purpose, the laser diode bias current Iv has to be at least equal to the threshold current IO corresponding to the dip. If the position of the dip changes owing to aging processes, also the laser diode bias current is to be changed, so that the above distortions do not occur in the light signal.

On the other hand, if the slope (steepness) of the second straight portion of the characteristic line of the laser diode changes, it will change the mean radiated power of the laser diode. Since this parameter too is to be maintained at a constant level, the part of the laser diode current superposed on the bias current—the so-called modulation current—is to be readjusted.

The actual changes of the characteristic line of the laser diode consist of a superpositioning of the two parts, that is to say the shift of the dip and the reduction of the steepness. Specifically this superpositioning forms the problem with the adjustment of the transmitter power of an optical transmitter, because it is possible without any problem to determine the combined effect, but not the effect of the individual addends.

In the known arrangement the modulation current contains two control signals having the same frequency and different amplitudes, whose phases have shifted through 180° relative to one another. The one control signal affects the modulation current at the top boundary and the other one at the bottom boundary. The overall laser diode current has the same effect as a laser diode current, whose bias current changes with the frequency of the control signals, as will be shown with reference to the derived formulas discussed hereinbelow.

Such a time-dependent bias current entails at least two disadvantages:

1. The light signal is full of jitter, because the time-dependent position of the edge of the light pulse depends on the fact from which value of the bias current onwards the laser diode current enhances.
2. Current variations in the neighbourhood of the laser diode threshold current introduce different light frequencies into the radiated laser light, so that the optical transmission spectrum is widened. Owing to the dispersion of the transmission medium this will lead to an additional distortion of the transmitted light signal.

SUMMARY OF THE INVENTION

It is an object of the invention to provide an optical transmitter of the type mentioned in the opening paragraph, in which the above jitter and the above distortions are avoided.

This object is accomplished with the aid of:

1.1. Means to multiply a control current by the useful signal, the control current being a d.c. current modulated by the pilot signal, 1.2. Filter means, isolating the amplitude of the component of the photoelectric current, whose frequency corresponds to the fundamental frequency of the pilot signal, and means to adjust the amplitude of the a.c. component of the control current in a manner such that the amplitude of the above component of the photoelectric current of the monitor diode remains constant, 1.3. Means, maintaining the amplitude ratio of the a.c. component to the d.c. component of the control current at a constant level, and 1.4. Filter means, determining the d.c. component of the photoelectric current of the monitor diode, and means to adjust the bias current of the laser diode in a manner such that also the d.c. component of the photoelectric current remains constant.

The solution according to the invention allows of incorporating circuitry in which fewer high-frequency transistors can be used than in comparable state-of-the-art circuits.

If the pilot signal carries information, the message linked to this signal can be disturbed by light reflected in the glass fibre. If the reflected light is incident on the laser diode, its threshold current, thus the bottom boundary of the modulation current, will be affected. Since, in accordance with the invention, the modulation current is affected only at the top boundary by the pilot signal, messages linked to the pilot signal cannot be disturbed by the changes in the threshold current.

Since the modulation factor of the control current is maintained at a constant level, for the case in which a message is transmitted with the pilot signal, this message can always be detected without any problem.

BRIEF DESCRIPTION OF THE DRAWING

An example of the embodiment of the invention will hereinafter be further explained with reference to the drawing Figures in which.

DETAILED DESCRIPTION OF THE PREFERRED EMBODIMENT

Figure 1:
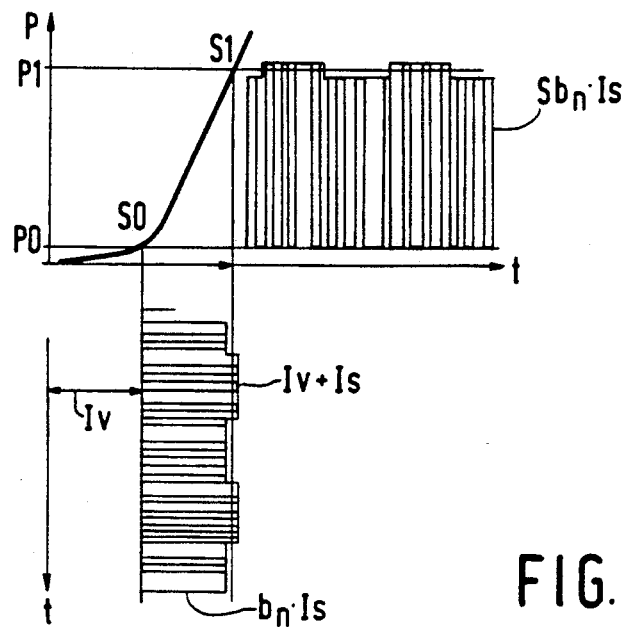
FIG. 1 shows a characteristic line of a laser diode with time diagrams of several components of the laser diode current and FIG. 2 shows the block diagram of an optical transmitter having characteristic features according to the invention.

In connection with the explanation of FIG. 1 also basic considerations are shown from which can be recognized how a circuit having the characteristic features of the invention resolves the problem posed. In all subsequent embodiments in this Application it is assumed that the useful signal and the pilot signal are binary signals.

The upper part of FIG. 1 shows a characteristic line of a laser diode, the radiated power P of the laser diode being plotted against the laser current IL. In the dip SO of the characteristic line the laser diode supplies the power PO when a current is passed through which is as large as the threshold current IO of the laser diode. In the case represented in the Figure the bias current Iv is chosen to be equal to the threshold current IO. The bias current Iv is the minimum laser diode current. The maximum laser diode current is composed of the sum of the bias current Iv and the maximum modulation current Im. In the case of a maximum modulation current the radiated light power of the laser diode at P1 is situated at the point S1 of the characteristic line. More accurately, the following holds for the laser diode current IL $$IL = Iv + Im = Iv + b_n * Is \qquad (1)$$

where $b_n$ is the $n^{th}$ bit (0 or 1) of the binary signal to be transmitted, whose frequency of the bit sequence is situated in the GHz range. The current Is is a control current, which is even modulated again by the frequency of a so-called pilot signal. The frequency of the bit sequence of the pilot signal is situated in the kHz range. The control current Is can unequivocally be divided into a d.c. component Ig and an a.c. component Iw, so that the following will hold:

$$Is = Ig + Iw = Ig + (1 - 2*B_k)*A = Ig*(1 + (1-2*B_k)*m). \qquad (2)$$

The d.c. component Ig is the mean value in time (or the zeroth Fourier coefficient) of the control current Is. The a.c. component Iw—whose mean value is zero—can be represented in the above form, where A is the amplitude of the a.c. component Iw and $B_k$ represents the $k^{th}$ bit (0 or 1) of the pilot signal. The representation, while employing the modulation factor m=A/Ig of the control current Is, is to be preferred hereinafter. The averaging operations discussed above take place during periods of time which are long compared to the bit duration of the pilot signal.

With the above abbreviations the following will hold for the overall laser diode current IL:

$$IL = Iv + b_n*Ig*(1 + (1-2*B_k)*m). \qquad (3)$$

In accordance with this current the following holds for the radiated actual light power P of the laser diode $$P = PO + b_n*S*Ig*(1 + (1-2*B_k)*m), \qquad (4)$$

with S for the steepness of the laser diode. From this formula the mean radiated power can be determined $$P = PO + \frac{S*Ig}{2} \qquad (5)$$

in which again averaging has taken place over periods of time that are long compared to the bit duration of the pilot signal. In support of the expression obtained for the mean radiated power P it should be pointed out that the value $\frac{1}{2}$ is found as the mean value of the bits $b_n$ as well as the mean value of the bits $B_k$. The mean value of the products of the bits $b_n*B_k$ is equal to the product of the mean values owing to the different bit durations. For, if the bits $b_n$ are averaged over a duration of a bit $B_k$, the value $\frac{1}{2}$ will already be found at that stage, because the averaging is effected over approximately $10^6$ bits $b_n$, whereas the bits $B_k$ are not involved in this averaging.

The mean light power P is to be maintained at a constant level under the secondary condition that the bias current Iv of the laser diode does not drop below the threshold current Is. As shown in equation 5 the power value P may change owing to a change of S and a change of PO. The change of PO is accompanied by a change in the dip of the characteristic line or a change of the threshold current IO respectively.

At this point a portion of the light power is converted into a photoelectric current Ip by a monitor diode. It holds that:

$$Ip = K*(PO + b_n*S*Ig*(1 + (1-2*B_k)*m), \qquad (6)$$

where K is a constant expressing the coupling of the laser diode to the monitor diode as well as the efficiency of the monitor diode. It is important that the constant K should not change during the aging process of the arrangement.

The photoelectric current Ip will now be divided into two components, which is possible with filter means. The first component is its d.c. component Ipg; it results from an averaging over periods of time which are long compared to the duration of the bits $B_k$, with:

$$Ipg = K*\left(PO + \frac{S*Ig}{2}\right). \qquad (7)$$

The second component is an a.c. component Ipw and represents the part of the photoelectric current which changes with the frequency of the pilot signal. It is obtained when the photoelectric current is first averaged over periods of time which are shorter than the duration of a bit $B_k$, but long compared to the duration of a bit $b_n$, and then the a.c. component is determined on the basis of this averaged value. It appears from:

$$Ipw = \frac{K*S*Ig*m*(1 - 2*B_k)}{2}. \qquad (8)$$

The amplitude of this a.c. component is $$Apw = \frac{m*K*Ig*S}{2} \qquad (9)$$

Apw is used according to the invention for adjusting the control current Is and Ipg for adjusting the laser diode bias current Iv, while the following conditions are to be considered:

1. The modulation factor m of the control current Is is maintained at a constant level by means of a circuit, that is to say, m remains independent of, for example, the age of the arrangement.

2. When the optical transmitter is taken into operation all parameters of the laser diode current IL are adjusted such that the requirements with respect to regular operation are fulfilled; Apw and Ipg thus have specific initial values. Now, if Ig is controlled in a manner such that Apw constantly maintains its initial value, the second term of the equation 5 will not change for the mean power P, because from equation 9 it follows that:

$$S*Ig = \frac{2*Apw}{m*K} \quad (10)$$

with on the right-hand side only constant values.

3. Due to the adjustment of Apw to its initial value also the second term of the current Ipg in equation 7 remains constant, so that a change of Ipg can only be attributed to a change of PO. Well, if Ipg is maintained at its initial value due to the change of the bias current Iv, also PO will be maintained at its initial value. However, this is only possible because the adjusting circuit always automatically adjusts the values of the bias current Iv such that it is situated (slightly) above the threshold current value IO or is equal thereto.

Figure 2:
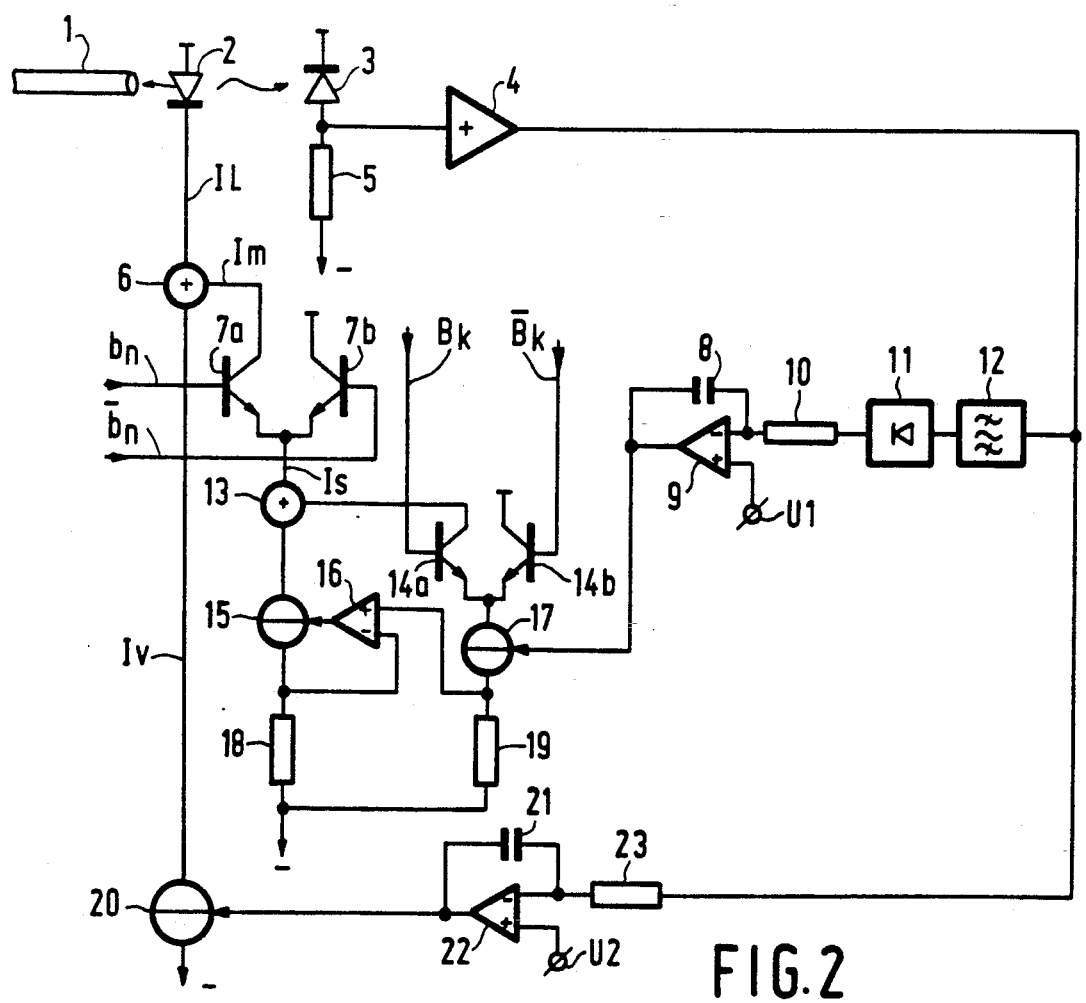

In the circuit arrangement represented in FIG. 2 the light signals to be transmitted are fed into a lightwave guide 1. The light signals are generated by a laser diode 2. Part of the light emitted by the laser diode is incident on a photoelectric diode 3 acting as a monitor diode. The photoelectric current Ip of the monitor diode is converted into a proportional voltage through a resistor 5 and amplified by an amplifier 4.

The output signal of the amplifier 4 is fed to a low-pass filter 12 as well as a first adjusting circuit 21, 22, 23, U2. The first adjusting circuit 21, 22, 23, U2, which includes an operational amplifier 22 which is fed back via a capacitor 21 and has an input resistor 23, determines the d.c. component in the output signal of the amplifier 4 which is proportional to the d.c. component Ipg (compare equation 7) of the photoelectric current. This component is compared to a voltage U2 which is set when the transmitter is taken into operation. The output signal of the first adjusting circuit is used as a setting quantity for a controllable current source 20 which supplies the bias current Iv (compare formula 1) for the laser diode 2.

The parameters of the band-pass filter 12 are chosen such that it filters out the components of the output signal of the amplifier 4, whose frequency corresponds with the fundamental frequency of the pilot signal. The output signal of the band-pass filter 12 passes through a full-wave rectifier 11, whose output signal is proportional to the amplitude Apw (compare formula 9) of the components filtered out by the band-pass filter 12. This amplitude is maintained at a level by means of a second adjusting circuit 8, 9, 10, U1 with the aid of a comparator voltage U1, which is set when the optical transmitter is taken into operation.

The output signal of the second adjusting circuit supplies the adjusting value for a further controllable current source 17, whose current strength, except for one factor, corresponds to the amplitude A of the a.c. component of the control current Is (compare formula 2). This amplitude is adjusted such that the output voltage of the full-wave rectifier 11 corresponds to the voltage U1.

The current of the current source 17 is multiplied by the bits of the pilot signal by means of the differential amplifier 14a, 14b, because the transistor 14a, 14b respectively, is driven by the bits $B_k$, inverted bits $\overline{B}_k$ respectively, of the pilot signal. At a summation point 13 the modulated current of the current source 17 is superimposed by the d.c. current of a further controllable current source 15. The result of the superpositioning is the control current Is according to formula 2. The degree of modulation of the control current Is is determined and maintained at a constant level in time by means of a comparator 16, whose output signal drives the control source 15, and resistors 18, 19 which allow the currents from the current sources 15 and 17 to pass through.

Through a further differential amplifier 7a, 7b the control current Is is multiplied by the bits of the useful signal. The bits $b_n$ are applied to the base of the transistor 7a, while the transistor 7b is driven by the inverted bits $\overline{b}_n$. The result of the multiplication is the modulation current Im (compare formula 1), which is added to the d.c. current Iv of the current source 20 at a second summation point 6. The sum current is the laser diode current IL according to formula 3.

I claim:

1. In an optical transmitter comprising a laser diode and, optically coupled to the laser diode a photo diode operating as a monitor diode, whose photoelectric current is used for adjusting the light power of the laser diode, and including modulators used for modulating the laser diode current by a first signal ($b_n$) and a second signal ($B_k$), wherein the improvement comprises:
   a) means for multiplying a control current (Is) by the first signal ($b_n$), the control current (Is) being a d.c. current modulated by the second signal ($B_k$),
   b) filter means coupled to the output of the monitor diode, isolating the amplitude of the component of the photoelectric current, whose frequency corresponds to the fundamental frequency of the second signal ($B_k$),
   c) means connected to the output of the monitor diode for adjusting the amplitude of the a.c. component of the control current (Is) in a manner such that the amplitude of the fundamental frequency component of the photoelectric current of the monitor diode remains constant,
   d) means for maintaining the modulation factor of the control current (Is) at a constant level,
   e) filter means connected to the output of the monitor diode, for determining the d.c. component of the photoelectric current of the monitor diode, and
   f) bias adjustment means coupled to the laser diode for adjusting the bias current (Iv) of the laser diode in a manner such that the d.c. component of the photoelectric current remains constant.

2. The optical transmitter as claimed in claim 1 wherein said first signal comprises a useful signal and said second signal comprises a pilot signal.

3. The optical transmitter as claimed in claim 1 wherein said first and second signals comprise binary signals.

* * * * *